United States Patent [19]

Nakamura et al.

[11] Patent Number: 5,510,324
[45] Date of Patent: Apr. 23, 1996

[54] METHOD FOR MANUFACTURING A SUPERCONDUCTING DEVICE HAVING AN EXTREMELY THIN SUPERCONDUCTING CHANNEL

[75] Inventors: Takao Nakamura; Michitomo Iiyama; Hiroshi Inada, all of Osaka, Japan

[73] Assignee: Sumitomo Electric Industries, Ltd., Osaka, Japan

[21] Appl. No.: 353,396

[22] Filed: Dec. 2, 1994

Related U.S. Application Data

[62] Division of Ser. No. 990,841, Dec. 14, 1992, Pat. No. 5,408,108.

[30] Foreign Application Priority Data

Dec. 12, 1991 [JP] Japan .................................. 3-351668
Feb. 17, 1992 [JP] Japan .................................. 4-61183
Dec. 8, 1992 [JP] Japan .................................. 4-351722

[51] Int. Cl.$^6$ ........................... H01L 39/24; H01L 39/22
[52] U.S. Cl. ................... 505/330; 505/410; 505/193; 505/191; 505/702; 427/62; 427/63; 257/34; 257/39
[58] Field of Search ........................... 505/330, 410, 505/193, 191, 702; 427/62, 63; 257/34, 39

[56] References Cited

U.S. PATENT DOCUMENTS

| | | | |
|---|---|---|---|
| 5,236,896 | 8/1993 | Nakamura et al. | 505/702 |
| 5,248,663 | 9/1993 | Noshiro et al. | 505/702 |
| 5,322,526 | 6/1994 | Nakamura et al. | 29/25.02 |
| 5,326,746 | 7/1994 | Ohtani et al. | 505/330 |

OTHER PUBLICATIONS

Olsson et al., "Crack formation in epitaxial [110] thin films of $YBa_2Cu_3O_{7-\delta}$ and $PrBa_2Cu_3O_{7-x}$ on [110]$SrTiO_3$ substrates," Appl. Phys. Lett., vol. 58, #15, 15 Apr. 1991, pp. 1682–1684.

Primary Examiner—Roy V. King
Attorney, Agent, or Firm—Foley & Lardner

[57] ABSTRACT

The invention relates to a method of manufacturing a superconducting device, which comprises the steps of forming on a principal surface of a substrate a non-superconducting oxide layer having a similar crystal structure to that of a c-axis oriented oxide superconductor thin film and a flat-top projection at its center portion, forming a c-axis oriented oxide superconductor thin film having an extremely thin thickness on the non-superconducting oxide layer so as to form a superconducting channel on the projecting portion of the non-superconducting oxide layer, forming an insulating layer on the c-axis oriented oxide superconductor thin film so as to form a gate insulating layer on the superconducting channel, and forming an a-axis oriented oxide superconductor thin film so as to form a superconducting source region and a superconducting drain region of which upper surfaces have the same level as that of the superconducting channel. The projecting portion of the non-superconducting oxide layer is preferably formed by a lift-off process using a lift-off layer formed of a CaO layer covered with a Zr layer which is removed by utilizing water and the following reaction:

$$CaO + H_2O \rightarrow Ca(OH)_2.$$

10 Claims, 2 Drawing Sheets

METHOD FOR MANUFACTURING A SUPERCONDUCTING DEVICE HAVING AN EXTREMELY THIN SUPERCONDUCTING CHANNEL

This application is a division of application Ser. No. 07/990,841, filed Dec. 14, 1992, now U.S. Pat. No. 5,408,108.

BACKGROUND OF THE INVENTION

1. Field of the Invention

The present invention relates to a superconducting device and a method for manufacturing the same, and more specifically to a superconducting device having an extremely thin superconducting channel formed of oxide superconductor material, and a method for manufacturing the same.

2. Description of Related Art

Devices which utilize superconducting phenomena operate rapidly with low power consumption so that they have higher performance than conventional semiconductor devices. Particularly, by using an oxide superconducting material which has been recently advanced in study, it is possible to produce a superconducting device which operates at relatively high temperature.

Josephson device is one of well-known superconducting devices. However, since Josephson device is a two-terminal device, a logic gate which utilizes Josephson devices becomes complicated configuration. Therefore, three-terminal superconducting devices are more practical.

Typical three-terminal superconducting devices include two types of super-FET (field effect transistor). The first type of the super-FET includes a semiconductor channel, and a superconductor source electrode and a superconductor drain electrode which are formed closely to each other on both side of the semiconductor channel. A portion of the semiconductor layer between the superconductor source electrode and the superconductor drain electrode has a greatly recessed or undercut rear surface so as to have a reduced thickness. In addition, a gate electrode is formed through a gate insulating layer on the portion of the recessed or undercut rear surface of the semiconductor layer between the superconductor source electrode and the superconductor drain electrode.

A superconducting current flows through the semiconductor layer (channel) between the superconductor source electrode and the superconductor drain electrode due to the superconducting proximity effect, and is controlled by an applied gate voltage. This type of the super-FET operates at a higher speed with a low power consumption.

The second type of the super-FET includes a channel of a superconductor formed between a source electrode and a drain electrode, so that a current flowing through the superconducting channel is controlled by a voltage applied to a gate formed above the superconducting channel.

Both of the super-FETs mentioned above are voltage controlled devices which are capable of isolating output signal from input one and of having a well defined gain.

However, since the first type of the super-FET utilizes the superconducting proximity effect, the superconductor source electrode and the superconductor drain electrode have to be positioned within a distance of a few times the coherence length of the superconductor materials of the superconductor source electrode and the superconductor drain electrode. In particular, since an oxide superconductor has a short coherence length, a distance between the superconductor source electrode and the superconductor drain electrode has to be made less than about ten nanometers, if the superconductor source electrode and the superconductor drain electrode are formed of the oxide superconductor material. However, it is very difficult to conduct a fine processing such as a fine pattern etching, so as to satisfying the very short separation distance mentioned above.

On the other hand, the super-FET having the superconducting channel has a large current capability, and the fine processing which is required to product the first type of the super-FET is not needed to product this type of super-FET.

In order to obtain a complete ON/OFF operation, both of the superconducting channel and the gate insulating layer should have an extremely thin thickness. For example, the superconducting channel formed of an oxide superconductor material should have a thickness of less than five nanometers and the gate insulating layer should have a thickness more than ten nanometers which is sufficient to prevent a tunnel current.

In the super-FET, since the extremely then superconducting channel is connected to the relatively thick superconducting source region and the superconducting drain region at their lower portion, the superconducting current flows substantially horizontally through the superconducting channel and substantially vertically in the superconducting source region and the superconducting drain region. Since the oxide superconductor has the largest critical current density $J_c$ in the direction perpendicular to c-axes of its crystal lattices, the superconducting channel is preferably formed of a c-axis oriented oxide superconducting thin film and the superconducting source region and the superconducting drain region are preferably formed of a-axis oriented oxide superconducting thin films.

In a prior art, in order to manufacture the super-FET which has the superconducting channel of c-axis oriented oxide superconducting thin film and the superconducting source region and the superconducting drain region of a-axis oriented oxide superconductor thin films, a c-axis oriented oxide superconductor thin film is formed at first and the c-axis oriented oxide superconductor thin film is etched and removed excluding a portion which will be the superconducting channel. Then, an a-axis oriented oxide superconductor thin film is deposited so as to form the superconducting source region and the superconducting drain region.

In another prior art, at first an a-axis oriented oxide superconductor thin film is deposited and etched so as to form the superconducting source region and the superconducting drain region, and then a c-axis oriented oxide superconductor thin film is deposited so as to form the superconducting channel.

However, in the prior art, the oxide superconductor thin film is degraded during the etching so that the superconducting characteristics is affected. In addition, the etched surface of the oxide superconductor thin film is roughened, therefore, if another oxide superconductor thin film is formed so as to contact the rough surface, an undesirable Josephson junction or resistance is generated at the interface.

By this performance of the super-FET manufactured by the above conventional process is degraded.

SUMMARY OF THE INVENTION

Accordingly, it is an object of the present invention to provide an FET type superconducting device having a superconducting region constituted of an extremely thin oxide superconductor film, which have overcome the above mentioned defects of the conventional ones.

Another object of the present invention is to provide a method for manufacturing an FET type superconducting device which have overcome the above mentioned defects of the conventional ones.

The above and other objects of the present invention are achieved in accordance with the present invention by a superconducting device comprising a substrate having a principal surface, a non-superconducting oxide layer having a similar crystal structure to that of the oxide superconductor, which has a flat-top projection at its center portion, a superconducting source region and a superconducting drain region formed of an a-axis oriented oxide superconductor thin film at the both sides of the projection of the non-superconducting drain region formed of an a-axis oriented oxide superconductor thin film at the both sides of the projection of the non-superconducting oxide layer separated from each other, an extremely thin superconducting channel formed of a c-axis oriented oxide superconductor thin film on the projection of the non-superconducting oxide layer, which electrically connects the superconducting source region to the superconducting drain region, so that superconducting current can flow through the superconducting channel between the superconducting source region and the superconducting drain region, and a gate electrode through a gate insulator on the superconducting channel for controlling the superconducting current flowing through the superconducting channel, in which the upper surfaces of the superconducting source region and the superconducting drain region are at the same level as that of the superconducting channel.

In the superconducting device in accordance with the present invention, upper surfaces of the superconducting channel, the superconducting source region and the superconducting drain region are at the same level. Therefore, superconducting current flows into or flows from the superconducting channel efficiently so that the current capability of the super-FET can be improved.

In the superconducting device in accordance with the present invention, the non-superconducting oxide layer preferably has a similar crystal structure to that of a c-axis oriented oxide superconductor thin film. In this case, the superconducting channel of a c-axis oriented oxide superconductor thin film can be easily formed on the projection.

Preferably, the above non-superconducting oxide layers is formed of a $Pr_jBa_2Cu_3O_{7-68}$ oxide. A c-axis oriented $Pr_1Ba_2Cu_3O_{7-\epsilon}$ thin film has almost the same crystal lattice structure as that of a c-axis oriented oxide superconductor thin film. It compensates an oxide superconductor thin film for its crystalline incompleteness at the bottom surface. Therefore, a c-axis oriented oxide superconductor thin film of high crystallinity can be easily formed on the c-axis oriented $Pr_1Ba_2Cu_3O_{7-\epsilon}$ thin film. In addition, the effect of diffusion of the constituent elements of $Pr_1Ba_2Cu_3O_{7-\epsilon}$ into the oxide superconductor thin film is negligible and it also prevents the diffusion from substrate. Thus, the oxide superconductor thin film deposited on the $Pr_1Ba_2Cu_3O_{7-\epsilon}$ thin film has a high quality.

In a preferred embodiment, the oxide superconductor is formed of high-$t_c$ (high critical temperature) oxide superconductor, particularly, formed of a high-$T_c$ copper-oxide type compound oxide superconductor for example a Y-Ba-Cu-O compound oxide superconductor material, a Bi-Sr-Ca-Cu-O compound oxide superconductor material, and a Tl-Ba-Ca-Cu-O compound oxide superconductor material.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystalline orientation. However, the superconducting device can be formed on a semiconductor substrate if an appropriate buffer layer is deposited thereon. For example, the buffer layer on the semiconductor substrate can be formed of a double-layer coating formed of a $MgAl_2O_4$ layer and a $BaTiO_3$ layer if silicon is used as a substrate.

Preferably, the superconducting channel is formed of a c-axis oriented oxide superconductor thin film and the superconducting source electrode and the superconducting drain electrode are formed of a-axis oriented oxide superconductor thin films.

According to another aspect of the present invention, there is provided method of manufacturing a superconducting device, comprising the steps of forming on a principal surface of a substrate a non-superconducting oxide layer having a similar crystal structure to that of a c-axis oriented oxide superconductor thin film and a flat-top projection at its center portion, forming a c-axis oriented oxide superconductor thin film having an extremely thin thickness on the non-superconducting oxide layer so as to form a superconducting channel on the projecting portion of the non-superconducting oxide layer, forming an insulating layer on the c-axis oriented oxide superconductor thin film so as to form a gate insulating layer on the superconducting channel, and forming an a-axis oriented oxide superconductor thin film so as to form a superconducting gate electrode on the gate insulating layer and a superconducting source region and a superconducting drain region of which upper surfaces have the same level as that of the superconducting channel.

In one preferred embodiment, the flat-top projection of the non-superconducting oxide layer is formed by a process which does not comprise any etching but lift-off. The process comprises the steps of forming on a principal surface of a substrate a lift-off layer excluding a portion on which the projection will be placed which can be removed without degrading the principal surface, forming a first non-superconducting oxide layer over the exposed portion of the principal surface and the lift-off layer, removing the lift-off layer so that a portion of the first non-superconducting oxide layer which will be the projection remains on the principal surface and the principal surface is exposed at the both sides of the remaining portion of the first non-superconducting oxide layer, and forming a second non-superconducting oxide layer having a thinner thickness than that of the first non-superconducting oxide layer over the exposed portion of the principal surface and the first non-superconducting oxide layer.

In this case, the lift-off layer is preferably formed of a CaO layer of which surface is covered with a Zr layer. This lift-off layer can be removed by utilizing water and following reaction:

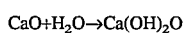

$$CaO + H_2O \rightarrow Ca(OH)_2O$$

In the above process, no reactive agent is used but water. Therefore, if the flat-top projection is formed by the above process, the substrate and the non-superconducting layer are not degraded.

The above and other objects, features and advantages of the present invention will be apparent from the following description of preferred embodiments of the invention with reference to the accompanying drawings.

DESCRIPTION OF THE PREFERRED EMBODIMENTS

Referring to FIGS. 1A to 1J, the process in accordance with the present invention for manufacturing the super-FET will be described.

Figure 1A:
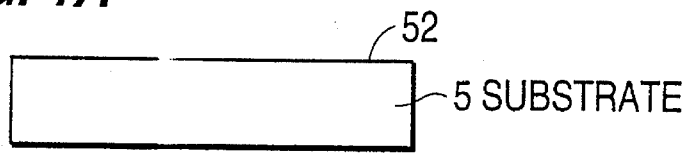
FIGS. 1A to 1J are diagrammatic sectional views for illustrating an embodiment of the process in accordance with the present invention for manufacturing the super-FET.

As shown in FIG. 1A, a MgO (100) single crystalline substrate 5 having a substantially planar principal surface 52 ((100)surface) is prepared.

Figure 1B:
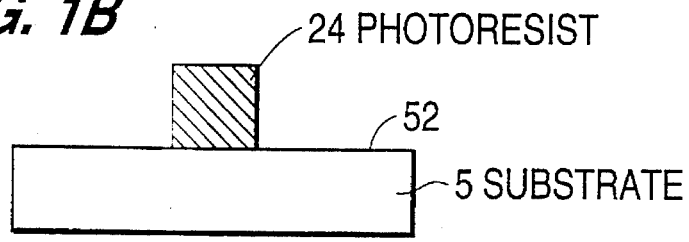
Figure 1C:
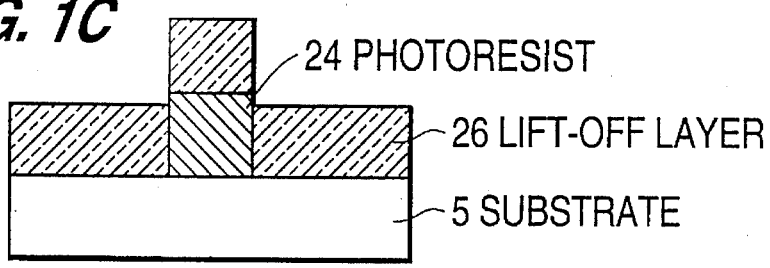

As shown in FIG. 1B, a photoresist 24 is patterned on a center portion of the principal surface 52. Then, as shown in FIG. 1C, a lift-off layer 26 of CaO layer covered with Zr layer having a thickness of 500 nanometers is deposited over the photoresist 24 and the exposed portion of the principal surface 52. This lift-off layer 26 is preferably formed by a sputtering in which temperature of the substrate 5 is room temperature.

Figure 1D:
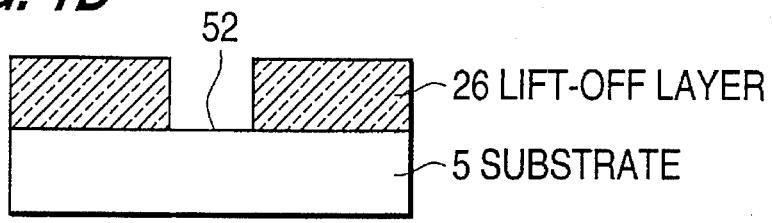

Thereafter, the photoresist 24 is removed so as to remove a portion of the lift-off layer 26 so that a portion of the principal surface 52 is exposed, as shown in FIG. 1D. Then, the substrate 5 is heated to a temperature of 350° to 400° C. under a pressure lower than $1\times10^{-9}$ Torr so as to clean the exposed portion of the principal surface 52.

Figure 1E:
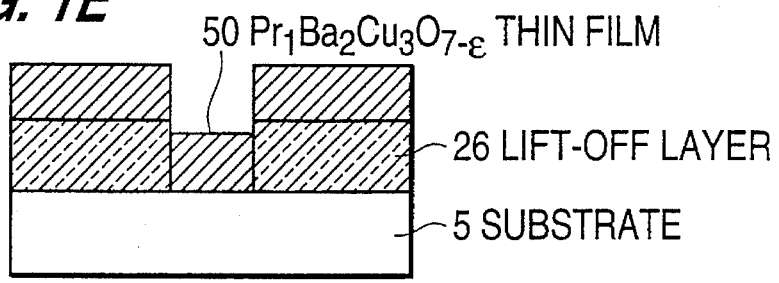

Thereafter, as shown in FIG. 1E, a $Pr_1Ba_2Cu_3O_{7-\epsilon}$ oxide thin film 50 having a thickness on the order of about 300 nanometers is deposited on the exposed portion of the principal surface 52 and the lift-off layer 26. The $Pr_1Ba_2Cu_3O_{7-\epsilon}$ oxide thin film 50 is preferably c-axis oriented and formed by an MBE (molecular beam epitaxy). A condition of forming the $Pr_1Ba_2Cu_3O_{7-\epsilon}$ oxide thin film 50 by an MBE is as follows:

| Molecular beam source | Pr | 1225° C. |
|---|---|---|
| | Ba | 600° C. |
| | Cu | 1040° C. |
| Pressure | $1\times10^{-5}$ Torr | |
| Temperature of the substrate | 700° C. | |

Figure 1F:
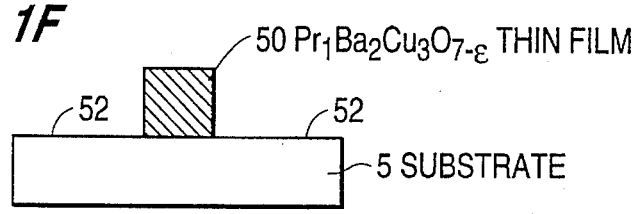

Then, the lift-off layer 26 is removed so as to remove the portion of the $Pr_1Ba_2Cu_3O_{7-\epsilon}$ oxide thin film 50 so that the $Pr_1Ba_2Cu_3O_{7-\epsilon}$ oxide thin film 50 is remained on the center portion of the principal surface 52 and the principal surface 52 is exposed at the both sides of the $Pr_1Ba_2Cu_3O_{7-\epsilon}$ oxide thin film 50, as shown in FIG. 1F. This lift-off process utilizes water and a following reaction:

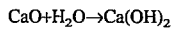

$$CaO + H_2O \rightarrow Ca(OH)_2$$

Since the lift-off process does not use an agent of high reactivity but user water, the $Pr_1Ba_2Cu_3O_{7-\epsilon}$ oxide thin film 50 and the substrate 5 are not degraded.

Thereafter, the substrate 5 is again heated to a temperature of 350° to 400° C. under pressure lower than $1\times10^{-9}$ Torr so as to clean the exposed portion of the principal surface 52.

Figure 1G:
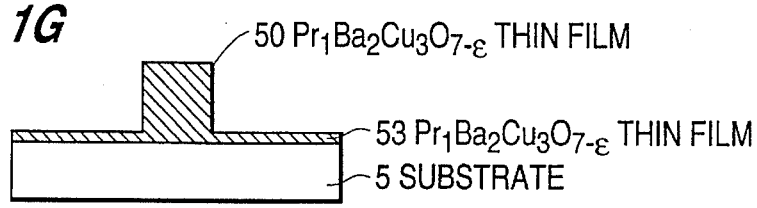

As shown in FIG. 1G, a $Pr_1Ba_2Cu_3O_{7-\epsilon}$ oxide thin film 53 having a thickness of 50 nanometers is again deposited on the $Pr_1Ba_2Cu_3O_{7-\epsilon}$ oxide thin film 50 and the exposed portion of the principal surface 52 by an MBE. A condition of forming the $Pr_1Ba_2Cu_3O_{7-\epsilon}$ oxide thin film 53 is the same as that of the $Pr_1Ba_2Cu_3O_{7-\epsilon}$ oxide thin film 50.

Figure 1H:
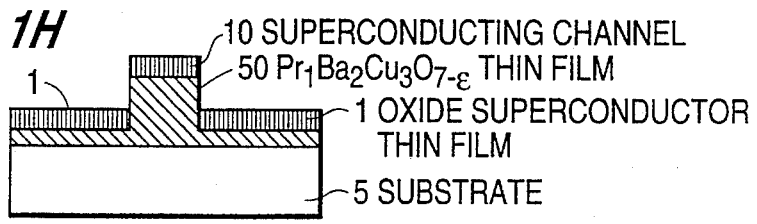

Thereafter, a c-axis oriented $Y_1Ba_2Cu_3O_{7-\delta}$ oxide superconductor thin film 1 having a thickness of 5 nanometers is deposited on the $Pr_1Ba_2Cu_3O_{7-\epsilon}$ oxide thin films 50 and 53 by an MBE, as shown in FIG. 1H. A condition of forming the $Y_1Ba_2Cu_3O_{7-\delta}$ oxide superconductor thin film 1 by an MBE is as follows:

| Molecular beam source | Pr | 1250° C. |
|---|---|---|
| | Ba | 600° C. |
| | Cu | 1040° C. |
| Pressure | $1\times10^{-5}$ Torr | |
| Temperature of the substrate | 700° C. | |

A portion of the deposited $Y_1Ba_2Cu_3O_{7-\delta}$ oxide superconductor thin film 1 on the $Pr_1Ba_2Cu_3O_{7-\epsilon}$ oxide thin film 50 becomes a superconducting channel 10. In this connection, a portion of the second $Pr_1Ba_2Cu_3O_{7-\epsilon}$ oxide thin film 53 which is deposited on the $Pr_1Ba_2Cu_3O_{7-\epsilon}$ oxide thin film 50 functions as a buffer layer on which a $Y_1Ba_2Cu_3O_{7-\delta}$ oxide thin film of high crystallinity grows easily.

Figure 1I:
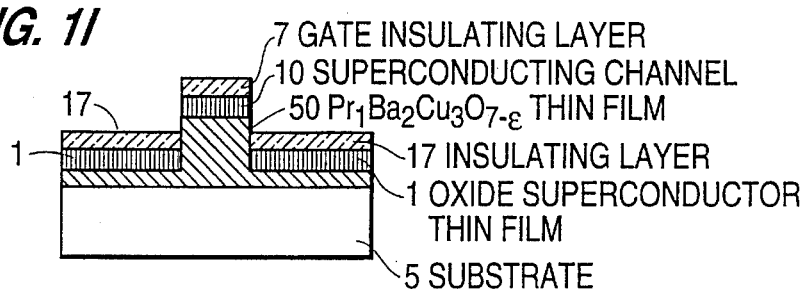

Then, an insulating layer 17 of MgO or $SrTiO_3$ is deposited on the $Y_1Ba_2Cu_3O_{7-\delta}$ oxide superconductor thin film 1, as shown in FIG. 1I. The insulating layer 17 is formed so as to have a thickness of 10 to 15 nanometers by an MBE. A portion of the insulating layer 17 on the superconducting channel 10 becomes a gate insulating layer 7.

Figure 1J:
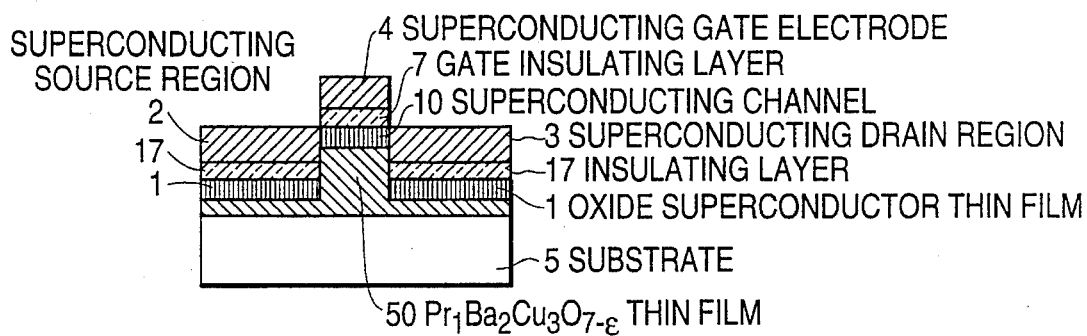

Finally, as shown in FIG. 1J, an a-axis oriented $Y_1Ba_2Cu_3O_{7-\delta}$ oxide superconductor thin film is deposited on the insulating layer 17 so as to form a superconducting source region 2 and a superconducting drain region 3 at the both sides of the $Pr_1Ba_2Cu_3O_{7-\delta}$ oxide thin film 50 and a superconducting gate electrode 4 on the gate insulating layer 7. The a-axis oriented $Y_1Ba_2Cu_3O_{7-\delta}$ oxide superconductor thin film is formed by an MBE so that the upper surfaces of the superconducting source region 2 and the superconducting drain region 3 have the same level as that of the superconducting channel 10. A condition of forming the a-axis oriented $Y_1Ba_2Cu_3O_{7-\delta}$ oxide superconductor thin film 1 by an MBE is as follows:

| Molecular beam source | Pr | 1250° C. |
|---|---|---|
| | Ba | 600° C. |
| | Cu | 1040° C. |
| Pressure | $1\times10^{-5}$ Torr | |
| Temperature of the substrate | 640° C. | |

Metal electrodes may be formed on the superconducting source region 2 and the superconducting drain region 3, if necessary. With this, the super-FET in accordance with the present invention is completed.

The above mentioned super-FET manufactured in accordance with the embodiment of the method of the present invention has no undesirable resistance nor undesirable Josephson junction between the superconducting channel and the superconducting source region and between the superconducting channel and the superconducting drain region. Since the upper surfaces of the superconducting source region and the superconducting drain region are at the same level as that of the superconducting channel, superconducting current efficiently flows into and out from the superconducting channel. In addition, in the above mentioned method in accordance with the present invention, the flat-top projecting portion of $Pr_1Ba_2Cu_3O_{7-\epsilon}$ oxide thin film on the substrate is formed without using etching process. Therefore, the portion has a high crystallinity so that the superconducting channel formed on the portion has a good superconducting characteristics. By this, the current capability of the super-FET can be improved.

In the above mentioned embodiment, the oxide superconductor thin film can be formed of not only the Y-Ba-Cu-O compound oxide superconductor material, but also a high-$T_c$ (high critical temperature) oxide superconductor material, particularly a high-$T_c$ copper-oxide type compound oxide superconductor material, for example a Bi-Sr-Ca-Cu-O compound oxide superconductor material, and a Tl-Ba-Ca-Cu-O compound oxide superconductor material.

The invention has thus been shown and described with reference to the specific embodiments. However, it should be noted that the present invention is in no way limited to the details of the illustrated structures and modifications may be made within the scope of the appended claims.

We claim:

1. A method of manufacturing a superconducting device, comprising the steps of:

forming on a principal surface of a substrate a non-superconducting oxide layer having a similar crystal structure to that of a c-axis oriented oxide superconductor thin film and a flat-top projection at its center portion, forming the c-axis oriented oxide superconductor thin film having an extremely thin thickness on the non-superconducting oxide layer so as to form a superconducting channel on the projecting portion of the non-superconducting oxide layer, forming an insulating layer on the c-axis oriented oxide superconductor thin film so as to form a gate insulating layer on the superconducting channel, and forming an a-axis oriented oxide superconductor thin film so as to form a superconducting gate electrode on the gate insulating layer and a superconducting source region and a superconducting drain region whose upper surfaces are coplanar with an upper surface as of the superconducting channel.

2. A method claimed in claim 1, wherein the flat-top projection of the non-superconducting oxide layer is formed by a process including the steps of:

forming on the principal surface of the substrate a lift-off layer excluding a portion on which the projection will be placed, said lift-off layer being removable without degrading the principal surface, forming a first non-superconducting oxide layer over the lift-off layer and the excluded portion of the principal surface, removing the lift-off layer so that a portion of the first non-superconducting oxide layer which will be the flat-top projection remains on the principal surface and the principal surface is exposed at both sides of the remaining portion of the first non-superconducting oxide layer, and forming a second non-superconducting oxide layer having a thinner thickness than that of the first non-superconducting oxide layer over the exposed portion of the principal surface and the remaining portion of the first non-superconducting oxide layer.

3. A method claimed in claim 2 wherein the lift-off layer is formed of a CaO layer covered with a Zr layer.

4. A method claimed in claim 3, wherein the lift-off layer is removed by utilizing water and following reaction:

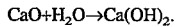

$$CaO + H_2O \rightarrow Ca(OH)_2.$$

5. A method as claimed in claim 1, wherein the non-superconducting oxide layer is formed of a $Pr_1Ba_2Cu_3O_{7-\epsilon}$ thin film.

6. A method as claimed in claim 1, wherein the oxide superconductor is formed of high-$T_c$ (high critical temperature) oxide superconductor.

7. A method as claimed in claim 6, wherein the oxide superconductor is formed of oxide superconductor material selected from the group consisting of a Y-Ba-Cu-O compound oxide superconductor material, a Bi-Sr-Ca-Cu-O compound oxide superconductor material, and a Tl-Ba-Ca-Cu-O compound oxide superconductor material.

8. A method as claimed in claim 1, wherein the substrate is formed of a material selected from the group consisting of MgO (100), $SrTiO_3$ (100) and $CdNdAlO_4$ (001).

9. A method as claimed in claim 8, wherein the substrate is formed of silicon and the principal surface of the silicon substrate is coated with an insulating material layer formed of $Mg_2AlO_4$ and $BaTiO_3$.

10. A method as claimed in claim 6, wherein the oxide superconductor is formed of a high-$T_c$ copper-oxide compound oxide superconductor.

* * * * *